(12) United States Patent
Sebanz et al.

(10) Patent No.: US 10,492,288 B2
(45) Date of Patent: Nov. 26, 2019

(54) METHOD OF MANUFACTURING A PRINTED CIRCUIT BOARD

(71) Applicant: AT & S AUSTRIA TECHNOLOGIE & SYSTEMTECHNIK AKTIENGESELLSCHAFT, Leoben-Hinterberg (AT)

(72) Inventors: Simon Sebanz, Leoben (AT); Hannes Voraberger, Graz (AT)

(73) Assignee: AT & S AUSTRIA TECHNOLOGIE & SYSTEMTECHNIK AKTIENGESELLSCHAFT, Leoben-Hinterberg (AT)

( * ) Notice: Subject to any disclaimer, the term of this patent is extended or adjusted under 35 U.S.C. 154(b) by 0 days.

(21) Appl. No.: 15/784,340

(22) Filed: Oct. 16, 2017

(65) Prior Publication Data

US 2018/0042099 A1 Feb. 8, 2018

Related U.S. Application Data

(62) Division of application No. 14/232,982, filed as application No. PCT/AU2012/000185 on Jul. 12, 2012, now Pat. No. 9,795,025.

(30) Foreign Application Priority Data

Jul. 15, 2011 (EP) .................................... 11450092

(51) Int. Cl.
*H05K 1/14* (2006.01)
*H05K 1/02* (2006.01)
(Continued)

(52) U.S. Cl.
CPC ............. *H05K 1/02* (2013.01); *H05K 3/0055* (2013.01); *H05K 3/4691* (2013.01);
(Continued)

(58) Field of Classification Search
CPC ... H05K 2201/0187; H05K 2201/0278; H05K 1/142; H05K 2201/2009; H05K 2201/048;
(Continued)

(56) References Cited

U.S. PATENT DOCUMENTS 4,687,695 A * 8/1987 Hamby ............... H05K 3/4691
174/254
5,219,292 A * 6/1993 Dickirson ............. H01R 9/096
439/65

(Continued)

FOREIGN PATENT DOCUMENTS

EP 2034810 A1 3/2009
JP 2008300658 A * 12/2008
(Continued)

OTHER PUBLICATIONS

International Search Report, dated Nov. 2, 2012.

*Primary Examiner* — Roshn K Varghese
(74) *Attorney, Agent, or Firm* — Jacobson Holman, PLLC.

(57) ABSTRACT

A method of manufacturing a printed circuit board or a sub-assembly thereof comprises the following steps:
  providing at least two elements (1, 3) of insulating material
  coupling or connecting the elements (1, 3) of insulating material on at least one adjacent side surface
  covering the elements (1, 3) of insulating material with a layer (4) of conductive material on at least one surface
  building up at least one further layer (5, 6, 7, 8) of the printed circuit board (10) at least partly on the elements (1, 3) of insulating material,
wherein the elements (1, 3) of insulating material are made of insulating material having different mechanical, chemical or physical properties.

(Continued)

Figures 1A, 1B, 1C, 1D, 1E, 1F, 1G:

Furthermore a printed circuit board (10) or sub-assembly thereof is provided.

4 Claims, 2 Drawing Sheets

(51) Int. Cl.
    *H05K 3/46*     (2006.01)
    *H05K 3/00*     (2006.01)

(52) U.S. Cl.
    CPC ............... *H05K 2201/0187* (2013.01); *H05K 2201/2072* (2013.01); *H05K 2203/1461* (2013.01); *Y10T 29/49155* (2015.01)

(58) Field of Classification Search
    CPC ...... H05K 1/0278; H05K 1/02; H05K 3/0055; H05K 3/4691; H05K 2201/2072; H05K 2203/1461
    USPC .......................................................... 361/786
    See application file for complete search history.

(56) References Cited

U.S. PATENT DOCUMENTS

| | | | |
|---|---|---|---|
| 5,285,352 | A | 2/1994 | Pastore |
| 5,288,542 | A | 2/1994 | Cibulsky |
| 9,095,069 | B2 | 7/2015 | Stefanoff |
| 2002/0080590 | A1* | 6/2002 | Bauermeister ......... H05K 1/142 361/803 |
| 2004/0112632 | A1* | 6/2004 | Michiwaki ........... H05K 3/4691 174/254 |
| 2007/0155194 | A1* | 7/2007 | Vega Martinez ...... H05K 1/142 439/62 |
| 2007/0281505 | A1 | 12/2007 | Kobayashi et al. |
| 2008/0099230 | A1 | 5/2008 | Takahashi et al. |
| 2009/0283301 | A1 | 11/2009 | Takahashi |

FOREIGN PATENT DOCUMENTS

| | | | |
|---|---|---|---|
| WO | WO 9311652 A1 * | 6/1993 | ........... H05K 3/4691 |
| WO | 2005/101928 A1 | 10/2005 | |
| WO | 2011/003123 A1 | 1/2011 | |

* cited by examiner

METHOD OF MANUFACTURING A PRINTED CIRCUIT BOARD

This is a national stage of PCT/AT12/000185 filed Jul. 12, 2012 and published in English, which has a priority of European no. 11450092.9 filed Jul. 15, 2011, hereby incorporated by reference

FIELD OF THE INVENTION

The present invention relates to a method of manufacturing a printed circuit board or a sub-assembly thereof comprising the following steps:
providing at least two elements of insulating material
coupling or connecting the elements of insulating material on at least one adjacent side surface
covering the elements of insulating material with a layer of conductive material on at least one surface
building up at least one further layer of the printed circuit board at least partly on the elements of insulating material.

PRIOR ART

Furthermore the present invention relates to a printed circuit board or a sub-assembly thereof comprising the following elements:
at least two elements of insulating material being coupled or connected on at least one side surface
at least one layer of conductive material on at least one surface of the elements of insulating material
at least one further layer of the printed circuit board being provided at least partly on the elements of insulating material.

Moreover the present invention relates to the use of such method or printed circuit board or sub-assembly.

A rigid-flex printed circuit board or a sub-assembly thereof can for example be taken from EP 2 034 810 A1 or US 2009/0283301 A1. A method of manufacturing a printed circuit board as well as a printed circuit board mentioned above can be taken from US 2008/099230. With these known embodiments it is necessary to insert a flexible material comprising a conductor pattern into respective recesses of rigid part(s) of a printed circuit board having already been provided with conductors or conductive elements. After having inserted the flexible part or element of the rigid-flex printed circuit board it is furthermore necessary to provide vias or similar structures for allowing a contact between the flexible element as well as the rigid element, and in particular the conductive patterns of these elements. Taking into account the small dimensions of conductors or conductive elements of a printed circuit board it is therefore necessary to precisely position the flexible element in the respective recess of the rigid element(s) for allowing a proper contacting thereof. Furthermore respective steps have to be taken for allowing a proper connection between the rigid substrate(s) and the flexible substrate of the rigid-flex printed circuit board.

From WO 2005/101928 A1 there can be taken a hybrid printed circuit board assembly system for the compact assembly of electric components aiming at simplifying the electric contacts.

From US 2007/0281505 A1 and WO 2011/003123 A1 there can be taken farther printed circuit boards consisting of different printed circuit board regions.

Furthermore there exist difficulties when combining or connecting different elements or parts of a printed circuit board for producing a combined printed circuit board comprising different layouts or structures of insulating material within the different parts. In particular an electrical connection between these parts is difficult to produce besides the necessary mechanical connection. Once more it is necessary to precisely position the different parts or elements to guarantee a proper contacting of electrical structures or conductive patterns of the different parts.

SUMMARY OF THE INVENTION

The present invention thus aims to avoid or minimize the above mentioned problems according to the prior art when providing or producing a printed circuit board comprising different parts or elements of insulating material in an inner region or part thereof. It is particularly aimed at providing a method as well as a printed circuit board or a sub-assembly thereof allowing a simplified connection between different elements of insulating material and in particular avoiding difficult and time-consuming steps for providing a proper contact between conductive patterns of the regions or parts of the printed circuit board comprising different parts of insulating material.

To solve these objects a method of manufacturing a printed circuit board or a sub-assembly thereof according to the kind mentioned above is essentially characterized in that the elements of insulating material are made of insulating material having different mechanical, chemical or physical properties and in that the at least one further layer of the printed circuit board is at least partly overlapping different elements of insulating material.

By providing at least two elements or parts of insulating material, coupling these elements of insulating material on at least one adjacent side surface and furthermore covering the elements of insulating material with a layer of conductive material on at least one surface it is possible to provide a core element or core material of a printed circuit board having already defined different regions or portions of insulating material in the core substrate. It will be possible according to the invention to provide a printed circuit board comprising different elements being for example based on different requirements therefore. In this context it is therefore proposed that the elements of insulating material are made of insulating material having different mechanical, chemical or physical properties. After connecting or coupling these elements of insulating materials it is possible to cover these insulating materials with a layer of conductive material and a simple conductive pattern or structure can be provided on all regions or parts of the printed circuit board or a sub-assembly thereof comprising different elements of insulating material. In contrast to the prior art it is therefore not necessary to provide vias or holes with great precision to allow a contact between the different elements of insulating material of the printed circuit board. Furthermore, according to the invention, it is possible to provide a proper as well as reliable connection between these different elements by directly positioning the conductive material on at least one surface of the core substrate comprising different elements of insulating material. After having provided such core substrate comprising already clearly defined portions or regions of a printed circuit board with different elements of insulating material comprising different properties at least one further layer of the printed circuit board will be built up at least partly on the elements of the insulating material allowing a simple structuring as well as manufacturing of such printed circuit board. For enhancing the connection between the elements of the printed circuit board it is furthermore proposed that the at least one further layer of the printed circuit board is partly overlapping the different elements of the insulating material.

As has already indicated above, by providing a core substrate comprising different elements of insulating material the production of such printed circuit board and in particular providing a contact between conductive elements thereof can be simplified. In this context it is proposed according to a preferred embodiment of the inventive method that the layer of conductive material is structured after having been connected, in particular laminated with the elements of insulating material. It is therefore possible to provide a core substrate comprising different elements of insulating material as well as a conductive pattern according to the requirements of the printed circuit board to be produced without necessitating additional steps for providing vias or holes allowing a contacting between conductive parts of the different parts or regions of the printed circuit board comprising different elements of insulating material.

In particular for allowing a buildup of further layers of a multi-layer printed circuit board on both sides of the core substrate it is furthermore proposed that the elements of insulating material are covered with a layer of conductive material on both surfaces according to a further preferred embodiment of the invention.

For allowing the usage of known process steps of manufacturing printed circuit boards, the layer(s) of conductive material may consist of copper.

In case of providing a printed circuit board comprising at least one element to be inserted into a larger element of the printed circuit board it is proposed according to another preferred embodiment that at least one of the elements of insulating material is provided with at least one cut-out portion for inserting another element of insulating material.

For providing a proper and stable connection as well as the necessary mechanical strength and stability between the elements of insulating material to be connected it is furthermore proposed that the elements of insulating material are provided with protrusions and corresponding recesses on adjacent side surfaces for mutual coupling or connection according to a further preferred embodiment of the invention.

For being able to provide a rigid-flexible printed circuit board it is furthermore proposed that at least one of the elements of insulating material to be connected or coupled is made of flexible material to be coupled or connected with an element made of rigid insulating material according to a preferred embodiment of the present invention.

A reliable connection between the different elements of insulating material being part of the core substrate can be preferably be provided by gluing or similar connecting techniques.

In many cases it is preferred to provide further layers of the printed circuit board to be produced covering essentially the whole area of the printed circuit board for allowing the usage of known method steps as well as known apparatus for producing such printed circuit boards. In this context it is therefore proposed according to a further preferred embodiment of the invention when using flexible elements of insulating material a further layer of the printed circuit board is removed at least partially according to a flexible element of the insulating material and/or is aligned with the flexible element(s) of insulating material. It is thus possible to use known method steps as well as devices for producing a printed circuit board, in particular comprising several layers of conductive as well as insulating or non-conductive materials, whereafter after completion of the buildup of the printed circuit board the flexible part(s) of a rigid-flexible circuit board are exposed by removing the further layer(s) of the printed circuit board overlapping the flexible part of the insulating material or core.

For allowing a simple production, in particular using known materials for producing printed circuit boards, the insulating material may consist of an insulating prepreg, in particular FR4 or a similar insulating material.

To solve the objects mentioned above a printed circuit board or a sub-assembly thereof according to the kind mentioned above is essentially characterized in that the elements of insulating material are made of insulating material having different mechanical, chemical or physical properties and in that the at least one further layer of the printed circuit board is at least partly overlapping different elements of insulating material.

As has already been indicated above, it is thus possible according to the present invention to provide a printed circuit board or a sub-assembly thereof starting from a core material comprising different elements of insulating material and at least one layer of conductive material allowing a simple and reliable connection between the different regions or parts of the printed circuit board to be produced as well as a simple and reliable production of conductive patterns or structures on the different parts or element of insulating material of the printed circuit board. For providing different elements or parts of the circuit board according to different requirements it is therefore proposed that the elements of insulating material are made of insulating material having different mechanical, chemical or physical properties. In particular it is not necessary to position the different elements of the printed circuit board with high precision relatively to one another. Furthermore it is not necessary to provide vias or holes for allowing a contact between conductive patterns or structures of the different parts or regions comprising different elements of insulating material of the printed circuit board as has been necessary with the known prior art. For allowing a reliable and safe connection between the elements of the printed circuit board to be produced as well as avoiding excessive strains or stresses on the different parts or elements thereof it is furthermore proposed that the at least one further layer or the printed circuit board is partly overlapping different elements of the insulating material.

According to a preferred embodiment it is proposed that a layer of structured conductive material is provided on at least one surface of the elements of insulating material, thereby providing a simple and reliable conductive pattern of structure both on the different elements of insulating material of the printed circuit board.

For allowing a buildup of a multilayer printed circuit board on both sides of the core substrate comprising different elements of insulating material it is furthermore proposed that the printed circuit board comprises a layer of structured conductive material on both surfaces of the elements of insulating material according to a preferred embodiment of the invention.

For providing a printed circuit board having inserted at least one element or part within a larger and surrounding element or part it is proposed according to a further preferred embodiment that at least one of the elements of insulating material is provided with at least one cut-out portion for inserting another element of insulating material.

For providing a stable connection as well as the necessary mechanical strength between the connected elements or parts it is furthermore proposed according to a preferred embodiment that the elements of insulating material are provided with protrusions and corresponding recesses on adjacent side surfaces for mutual coupling or connection.

For providing a simple structure of a rigid-flexible printed circuit board, it is proposed that at least one of the elements of insulating material to be connected or coupled is made of flexible material to be coupled or connected with an element made of rigid insulating material according to a further preferred embodiment of the present invention.

As has been already indicated above, in certain cases a buildup of further layers of the printed circuit board covering the different elements or parts may be preferred taking into account known method steps. In such case if is preferred according to further embodiment of the present invention that when using flexible elements of insulating material a further layer of the printed circuit board is provided with an opening at least partially according to a flexible element of the insulating material and/or is aligned with the flexible element(s) of insulating material.

A reliable conductive structure or pattern will be provided when the layer(s) of conductive material is (are) made of copper.

Furthermore the insulating material may consist of an insulating prepreg, in particular FR4 or a similar insulating material.

According to the invention it is furthermore proposed to use a method according to the invention or a preferred embodiment thereof as well as a printed circuit board or a sub-assembly thereof for producing a flexible, rigid, rigid-flexible or semi-flexible printed circuit board or a sub-assembly thereof and/or a high frequency, HDI or ceramic printed circuit board or a sub-assembly thereof.

In summary, according to the invention there is provided a method of manufacturing a printed circuit board or a sub-assembly thereof avoiding the necessity of connecting or coupling different parts or regions of a printed circuit board comprising different elements of insulating core material with high precision and furthermore requiring additional steps for providing contacts between the different parts or elements. The different portions or parts of the printed circuit board comprising different elements of insulating material are already provided and defined in the core substrate comprising different parts or elements. This core substrate is furthermore laminated or provided with at least one layer of conductive material on one surface which can be produced beforehand and taking into account in particular the dimensions as well the position of the different elements of insulating core material of the printed circuit board to be produced. By providing such core substrate comprising different parts or elements of insulating material as well as at least one layer of conductive material on one surface there can be ascertained a reliable and safe connection between these different parts and elements. Furthermore by simply structuring the conductive material or layer of such laminated core substrate it will be possible to provide a conductive structure or pattern both on these different parts or regions or elements thereby providing the electrical connection between these elements. It is thus possible to produce or provide a printed circuit board or a sub-assembly thereof with less process steps and to provide a selective core substrate being less expensive, in particular taking into account the simple construction. Furthermore a registration of the elements or the printed circuit board, in particular during following production steps is simplified and the requirements regarding registration or precision of positioning both for connecting the different elements or parts as well as during the buildup of further layers of a multilayer printed circuit board are reduced. In particular it is not necessary to take special care regarding the different parts or elements being defined in the core substrate, resulting in the possibility of using standard alignment devices normally being used with the production of printed circuit boards.

SHORT DESCRIPTION OF THE DRAWINGS

Figure 2:
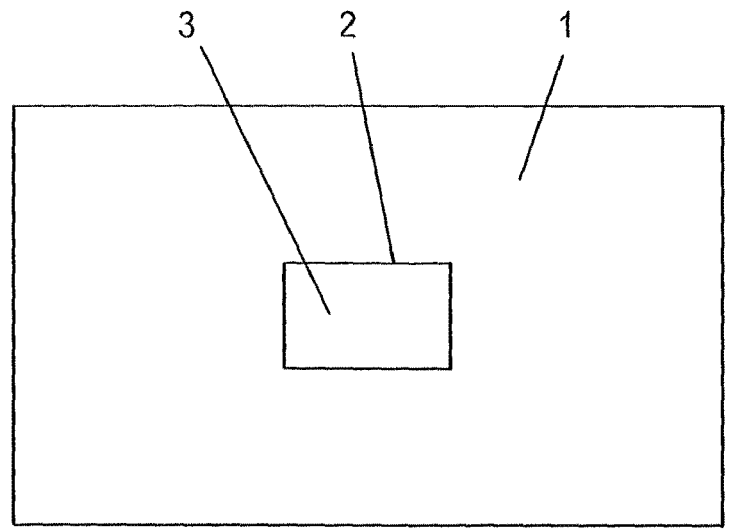
Figure 3:
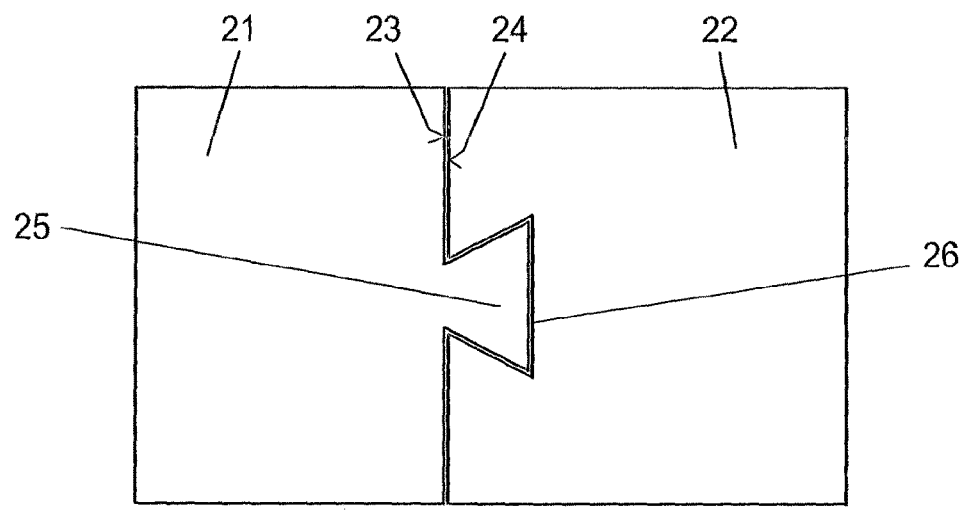

In the following the invention will be explained in more detail by way of exemplary embodiments schematically illustrated in the accompanying drawing. Therein:

FIGS. 1 to 1g depict different steps of a method according to the invention for manufacturing a printed circuit board or a sub-assembly thereof according to the invention;

FIG. 2 depicts a schematic plan view according to arrow II of FIG. 1c indicating the relative position between different parts or elements of insulating material; and FIG. 3 is a schematic plan view similar to FIG. 2 showing the connection between different parts or elements of insulating material being provided with coupling elements according to a further embodiment of the inventive printed circuit board.

DETAILED DESCRIPTION OF PREFERRED EMBODIMENTS

In a first method step according to FIG. 1a a first insulating layer 1 of insulating material, for example an insulating prepreg, in particular FR4, is provided.

According to FIG. 1b in a further method step an area 2 is removed from the first insulating material 1.

Into this cut-out area 2 another insulating material 3 is inserted according to FIG. 1c.

Thereafter on at least one surface, and in particular on both surfaces, as can be taken from the method step being shown in FIG. 1d, layers 4 of conductive material are provided on both surfaces of the first insulating material 1 as well as the second insulating material 3 having been inserted into the removed or cut-cut area 2.

According to the method step being shown in FIG. 1d there is provided a core substrate comprising different insulating materials 1 and 3 and layers 4 of conductive material allowing a further buildup of further layers of a printed circuit board or sub-assembly thereof to be provided, as can be taken from the following figures.

In FIG. 1e it is furthermore shown that the layers 4 of conductive material, having been provided according to FIG. 1d, are structured for providing a conductive structure or pattern on both surfaces or sides of the core substrate comprising different parts or elements 1 and 3.

Thereafter according to FIG. 1f further layers of a multilayer printed circuit board being designated as 5, 6, 7 and 8 are provided. From FIG. 1f if it can be clearly taken that these further layers are overlapping both elements 1 and 3 of the core substrate as well as the structured layers 4 allowing the usage of known production methods or steps for producing printed circuit boards.

In particular the method steps being shown in FIGS. 1e and 1f for structuring any conductive layers, being designated with 6 and 8 in FIG. 1f as well a further buildup of multiple layers of the printed circuit board 10 can be repeated several times according to the respective requirements, being schematically indicated with the vertical line of points in FIG. 1.

After completion of the buildup of the printed circuit board being indicated generally with 10 in FIG. 1g any part(s) of the multilayer structure of the circuit board 10 overlapping the second element or part 3 of the core substrate may be removed, being indicated with 11 in FIG. 1g, in particular in case of producing a rigid-flexible printed circuit board 10 when using a rigid material as first insulating material 1 and a flexible material as second insulating material 3.

Thereby the flexible part of the rigid-flex printed circuit board 10 being provided according to FIG. 1g can be provided on the basis of the position of the flexible insulating material 3 of the rigid-flex core substrate.

From FIG. 1g it can be taken that any further layers building up the multilayers in particular rigid-flex printed circuit board 10 are partly overlapping the region of contact between the parts or elements 1 with the element 3 providing a better connection of the different parts 1 and 3 and avoiding excessive attains or mechanical stresses, in particular in the region of the connection between the parts or elements 1 and 3.

In FIG. 2 there is schematically shorn that the part or element 3 of the second insulating material is inserted into a respective cut-out area 2 of the surrounding element or part 1 of the first insulating material.

From the schematic drawing of FIG. 3 it can be taken that different insulating materials 21 and 22 are connected on at least one adjacent side surface 23 and 24. For assisting the coupling or connection of the insulating materials 21 and 22 the insulating material 21 is provided with a protrusion 25 fitting into a corresponding recess 26 of the second insulating material 22.

After connecting the elements 21 and 22 of different insulating material comprising different mechanical, physical or chemical properties as being indicated in FIG. 3 a further build-up of the layers of a printed circuit board will take place, for example according to the further method steps being shown in FIG. 1d to FIG. 1g.

If necessary, a respective number of protrusions 25 as well as corresponding recesses 26 may be provided on the side surfaces 23 and 24.

Furthermore such corresponding protrusions and recesses 25 and 26 may also be provided when inserting an insulating material into a cut-out area of another surrounding or larger insulating material, as can be taken from FIGS. 1 and 2.

According to the necessary requirement the insulating materials 1 and 3 or 21 and 22 have different mechanical, chemical or physical properties, such as is for example indicated in FIG. 1 comprising a rigid insulating material 1 as well as a flexible insulating material 3.

Being based on the different insulating materials being used there may be provided a flexible, rigid, rigid-flexible or semi-flexible printed circuit board or a sub-assembly thereof.

The invention claimed is:

1. A printed circuit board or a sub-assembly thereof comprising the following elements:
    at least two elements of insulating material being coupled or connected on at least one side surface, wherein one of the at least two elements is arranged in a cut-out area of the other one of the at least two elements;
    at least one layer of structured conductive material directly on both adjacent surfaces of the adjacent two elements of insulating material; and
    at least one further layer of the printed circuit board being provided at least partly directly on the elements of insulating material,
wherein the elements of insulating material are made of insulating material having different mechanical, chemical or physical properties,
wherein the at least one further layer of the printed circuit board provided at directly on the at least two elements of insulating material is at least partly overlapping both of the two elements of insulating material, one of the at least two elements of insulating material being arranged in the cut-out area and the other one of the at least two elements of insulating material comprising the cut-out area, wherein the at least one layer of structured conductive material is arranged between the at least one further layer of the printed circuit board and the two elements of insulating material, such that the at least one layer of structured conductive material is directly in contact with the at least one further layer of the printed circuit board and with both adjacent surfaces of the adjacent elements of insulating material;
wherein conductive material of the layer of structured conductive material is removed from parts of the element of insulating material in the cut-out area such that the parts of the element of insulating material are exposed to air.

2. The printed circuit board or a sub-assembly thereof according to claim 1, wherein the elements of insulating material are provided with protrusions and corresponding recesses on adjacent side surfaces for mutual coupling or connection.

3. The printed circuit board or a sub-assembly thereof according to claim 1, wherein at least one of the elements of insulating material to be connected or coupled is made of flexible material to be coupled or connected with an element made of rigid insulating material.

4. The printed circuit board or a sub-assembly thereof according to claim 1, wherein when using flexible elements of insulating material a further layer of the printed circuit board is provided, with an opening at least partially according to a flexible element of the insulating material and/or is aligned with the flexible elements of the insulating material.

* * * * *